(12) United States Patent
Zheng et al.

(10) Patent No.: US 9,911,593 B2
(45) Date of Patent: Mar. 6, 2018

(54) NAND FLASH MEMORY AND FABRICATION METHODS THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Erhu Zheng, Shanghai (CN); Shiliang Ji, Shanghai (CN); Yiying Zhang, Shanghai (CN)

(73) Assignees: SEIMCONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 15/244,875

(22) Filed: Aug. 23, 2016

(65) Prior Publication Data
US 2017/0170011 A1 Jun. 15, 2017

(30) Foreign Application Priority Data
Dec. 10, 2015 (CN) .......................... 2015 1 0919128

(51) Int. Cl.
*H01L 21/02* (2006.01)
*H01L 21/768* (2006.01)
(Continued)

(52) U.S. Cl.
CPC .. *H01L 21/02285* (2013.01); *H01L 21/02118* (2013.01); *H01L 21/02343* (2013.01);
(Continued)

(58) Field of Classification Search
None
See application file for complete search history.

(56) References Cited

U.S. PATENT DOCUMENTS

2003/0219536 A1* 11/2003 Shin ........................ C23C 16/42
427/255.28
2006/0281336 A1 12/2006 Arisumi et al.
(Continued)

OTHER PUBLICATIONS

X. Huang, et al., Is graphene oxide an insulating material? 2013 IEEE International Conference on Solid Dielectrics (ICSD), Bologna, Italy, Jun. 30-Jul. 4, 2013, pp. 904-907.

*Primary Examiner* — Hoang-Quan Ho
(74) *Attorney, Agent, or Firm* — Anova Law Group, PLLC

(57) ABSTRACT

A method for fabricating an NAND flash memory includes providing a semiconductor substrate with a core region and a peripheral region, forming a plurality of discrete gate stack structures in the core region with neighboring gate stack structures separated by a first dielectric layer. The method further includes forming a flowable dielectric layer on the first dielectric layer and the gate stack structures, and forming a solid dielectric layer through a solidification treatment process performed on the flowable dielectric layer. Voids and seams formed in the top portion of the first dielectric layer are filled by the solid dielectric layer. The method also includes removing the solid dielectric layer and a portion of the first dielectric layer to expose a top portion of the gate stack structures, and forming a metal silicide layer on each gate stack structure.

16 Claims, 7 Drawing Sheets

(51) Int. Cl.
*H01L 21/3105* (2006.01)
*H01L 21/28* (2006.01)
*H01L 27/11524* (2017.01)
*H01L 27/11529* (2017.01)
*H01L 29/788* (2006.01)
*H01L 21/762* (2006.01)
*H01L 27/11521* (2017.01)
*H01L 27/11531* (2017.01)
H01L 29/768 (2006.01)
H01L 27/115 (2017.01)
H01L 29/66 (2006.01)

(52) U.S. Cl.
CPC .. *H01L 21/02356* (2013.01); *H01L 21/28273* (2013.01); *H01L 21/31051* (2013.01); *H01L 21/31053* (2013.01); *H01L 21/76224* (2013.01); *H01L 21/76801* (2013.01); *H01L 21/76826* (2013.01); *H01L 27/11521* (2013.01); *H01L 27/11524* (2013.01); *H01L 27/11529* (2013.01); *H01L 27/11531* (2013.01); *H01L 29/66825* (2013.01); *H01L 29/7887* (2013.01); *H01L 29/665* (2013.01)

(56) References Cited

U.S. PATENT DOCUMENTS

| | | | |
|---|---|---|---|
| 2009/0194810 A1 | 8/2009 | Kiyotoshi | |
| 2010/0167490 A1 | 7/2010 | Choi et al. | |
| 2013/0084696 A1* | 4/2013 | Kim | H01L 21/764 438/588 |
| 2014/0077304 A1* | 3/2014 | Huang | H01L 21/764 257/368 |

* cited by examiner

NAND FLASH MEMORY AND FABRICATION METHODS THEREOF

CROSS-REFERENCES TO RELATED APPLICATIONS

This application claims the priority of Chinese Patent Application No. CN201510919128.2, filed on Dec. 10, 2015, the entire content of which is incorporated herein by reference.

FIELD OF THE DISCLOSURE

The present disclosure generally relates to the field of semiconductor fabrication technology and, more particularly, relates to an NAND flash memory and fabrication methods thereof.

BACKGROUND

As compared to hard disk drives, Not AND (NAND) flash memory provides a more advanced data-storage method. Specifically, by using page as unit for data reading and data writing, NAND flash memory is a desired solution for storing continuous data, such as images, audio, and other types of data files. In the meantime, because of the advantages that NAND flash memory demonstrates, e.g. low product cost, large storage capacity, and fast writing and fast erasing, NAND flash memory has been widely used in the field of mobile communication devices and portable multimedia devices.

However, for NAND flash memory fabricated by existing methods, the risk of current leaking between word lines may be high. The disclosed fabrication method and NAND flash memory are directed to solve one or more problems set forth above and other problems in the art.

BRIEF SUMMARY OF THE DISCLOSURE

One aspect of the present disclosure includes a method for fabricating an NAND flash memory. The method includes providing a semiconductor substrate with a core region and a peripheral region, forming a plurality of discrete gate stack structures in the core region with neighboring gate stack structures separated by a trench, and forming a first dielectric layer to fill each trench. The method further includes forming a flowable dielectric layer on the first dielectric layer and the gate stack structures, and then performing a solidification treatment process on the flowable dielectric layer to form a solid dielectric layer. Voids and seams formed in the top portion of the first dielectric layer are filled by the solid dielectric layer. The method also includes removing the solid dielectric layer and a portion of the first dielectric layer to expose at least a top portion of the gate stack structures, forming a metal silicide layer on an exposed portion of the gate stack structures and the first dielectric layer, and then removing a portion of the metal silicide layer formed on the first dielectric layer.

Another aspect of the present disclosure provides an NAND flash memory. The NAND flash memory includes a semiconductor substrate including a core region and a peripheral region, a plurality of discrete gate stack structures formed in the core region with neighboring gate stack structures separated by a trench, and a first dielectric layer filling up each trench. Voids and seams formed in the top portion of the first dielectric layer are filled by a solid dielectric layer. The solid dielectric layer is formed through a solidification treatment process performed on a flowable dielectric layer formed on the first dielectric layer. The solid dielectric layer formed above the top surface of the first dielectric layer is then removed. The NAND flash memory further includes a second dielectric layer formed on the peripheral region, and a metal silicide layer formed on a top surface of each gate stack structure. The metal silicide layer formed on each gate stack structure serves as a word line.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

FIGS. 1-5 illustrate schematic cross-section views of an NAND flash memory corresponding to certain stages of an existing fabrication method in the current technology.

Figure 1:
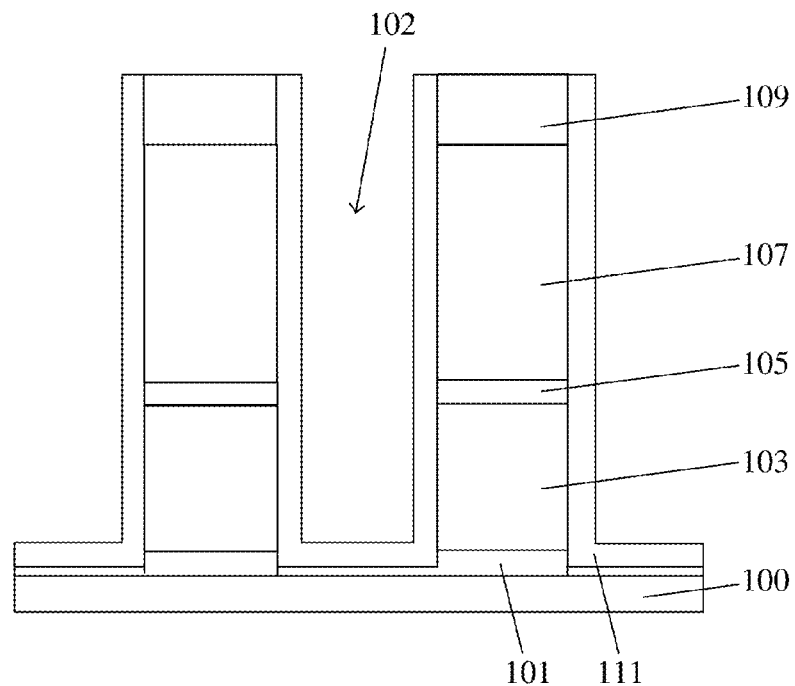
FIGS. 1-5 illustrate schematic views of semiconductor structures corresponding to certain stages of an existing fabrication method for an NAND flash memory.

Referring to FIG. 1, a semiconductor substrate 100 is provided. The semiconductor substrate 100 includes a core region (not labeled) and a peripheral region (not shown). For illustration purposes, only a portion of the core region is shown in FIGS. 1-5, while the peripheral region is not shown.

Referring to FIG. 1, a plurality of discrete gate stack structures (not labeled) are formed on the core region. From the bottom to the top, each gate stack structure includes a tunnel oxide layer 101, a floating gate layer 103, a dielectric layer 105, and a control gate layer 107. In addition, a mask layer 109 is also formed on the gate stack structures. Further, a plurality of trenches 102 are formed between neighboring gate stack structures. A plurality of sidewalls 111 are formed on the side surfaces of the plurality of gate stack structures. The plurality of sidewalls 111 cover the bottom and the side surfaces of the plurality of trenches 102.

Figure 2:
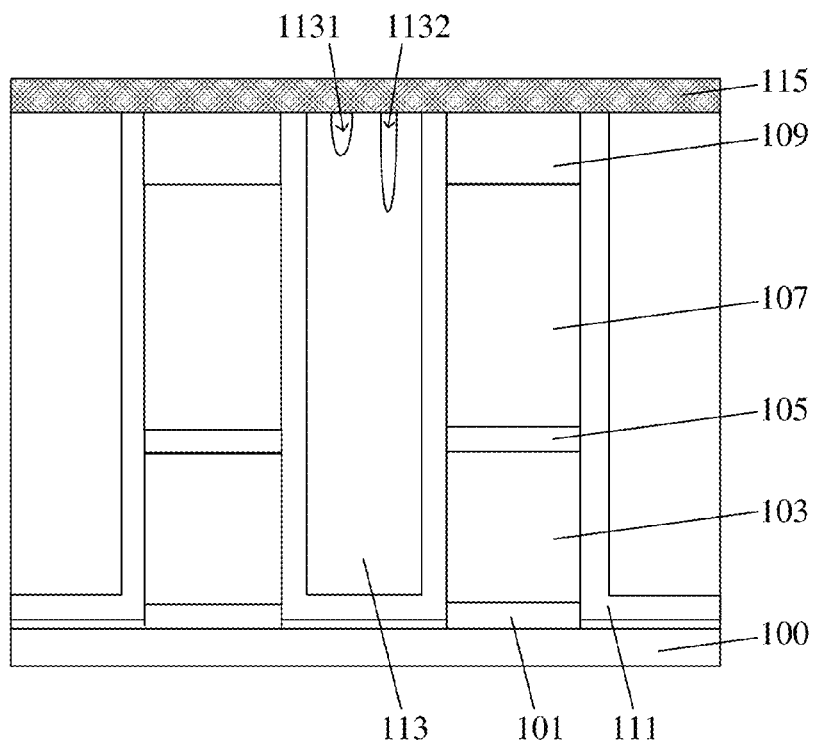

Further, referring to FIG. 2, a first dielectric layer 113 is formed to fill the plurality of trenches 102. A stop layer 115 is then formed on the surfaces of the first dielectric layer 113 and the mask layer 109. The stop layer 115 also covers the top surface of the plurality of sidewalls 111.

After forming the stop layer 115, a second dielectric layer (not shown) is further formed on the peripheral region (not shown) and also on the stop layer 115 of the core region. The second dielectric layer is intended to be formed only on the peripheral region and, thus, a subsequent process to remove the portion of the second dielectric layer formed in the core region is required.

For example, a planarization process is performed to remove the portion of the second dielectric layer formed on the stop layer 115. The planarization process is stopped when the stop layer 115 is exposed. Thus, the portion of the second dielectric layer formed in the core region is then removed by the planarization process.

Figure 3:
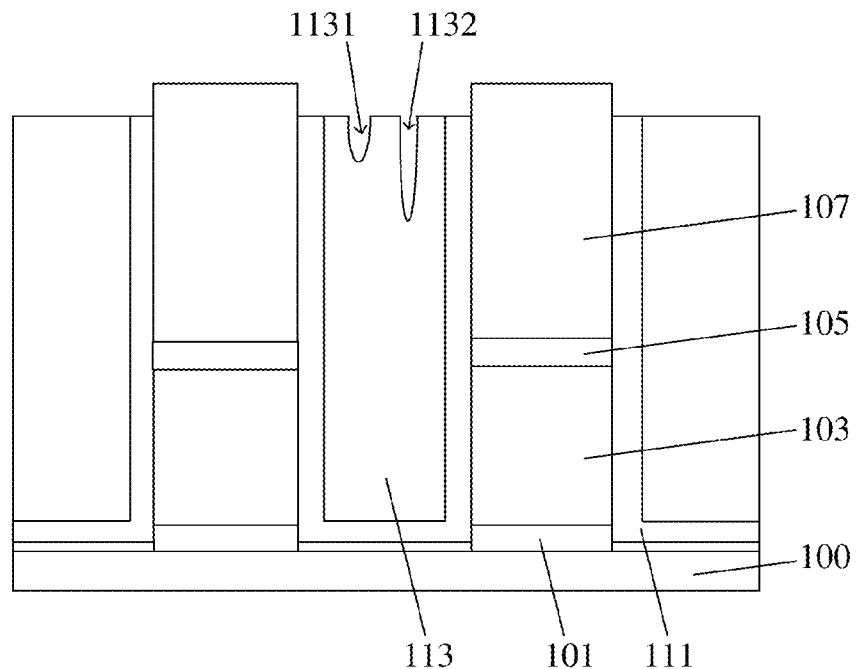

Referring to FIG. 3, the remaining portion of the stop layer 115 together with the mask layer 109 (referring to FIG. 2) and a portion of the first dielectric layer 113 are removed by an etch-back process to expose at least a portion of each gate stack structure. As shown in FIG. 3, the portion of each gate stack structure exposed after the etch-back process is a portion of the control gate layer 107. That is, the top surface and a portion of the side surface of the control gate layer 107 are exposed after the etch-back process.

Figure 4:
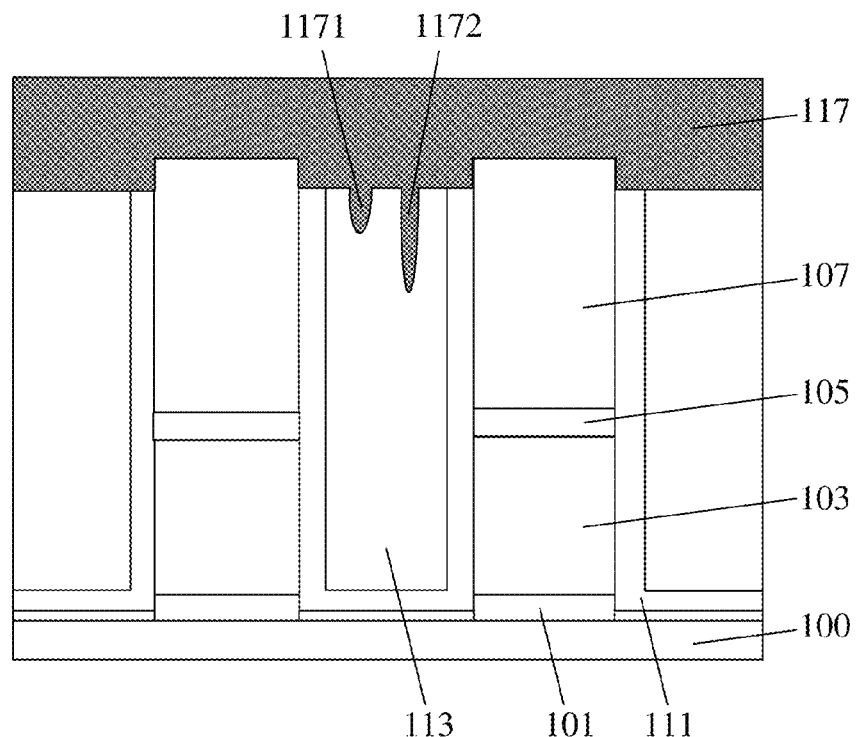
Figure 5:
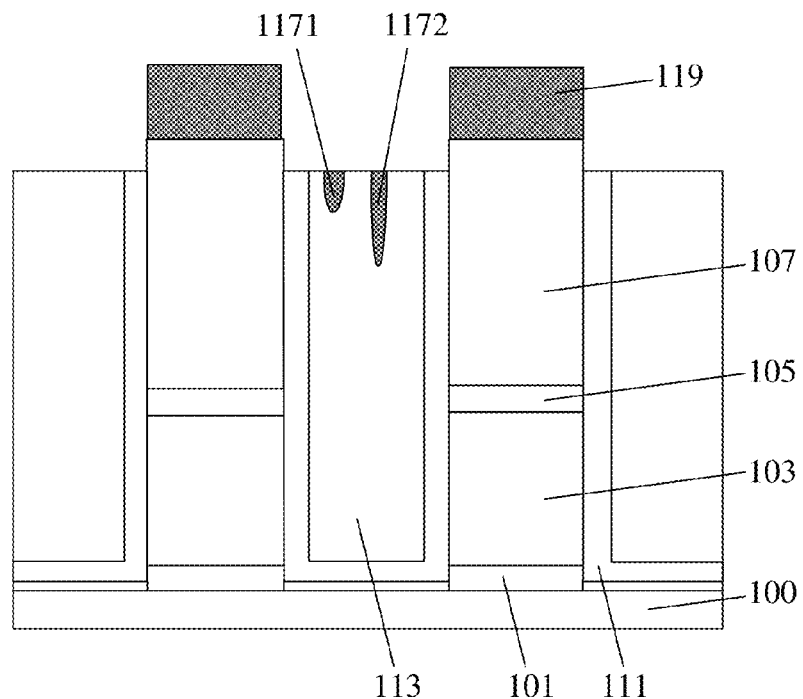

Referring to FIG. 4 and FIG. 5, a metal silicide layer 117 is formed to cover the top and the side surfaces of the exposed portion of the control gate layer 107 and also cover the first dielectric layer 113. As shown in FIG. 4, the portion of the metal silicide layer 117 covering the first dielectric layer 113 is then removed and, thus, only the portion of the metal silicide layer 117 covering the control gate layer 107 remains. The remaining portion of the metal silicide layer 117 serves as word lines 119 as shown in FIG. 5.

However, referring to FIG. 2, during the formation of the first dielectric layer 113, a variety of voids 1131 and a variety of seams 1132 may appear in the formed first dielectric layer 113. For illustration purposes, the structure shown in FIG. 2 is described to contain one void 1131 and one seam 1132. Any number of the voids 1131 and/or the seams 1132 can occur in the first dielectric layer.

As shown in FIG. 3, after performing the etch-back process, the void 1131 and the seam 1132 formed in the first dielectric layer 113 may be exposed at the surface of the etched first dielectric layer 113. That is, the etch-back process may be stopped at a level cutting through the void 1131 and the seam 1132.

Further, during the formation of the metal silicide layer 117, when the metal silicide material is formed to cover the first dielectric layer 113, the void 1131 and the seam 1132 may also be filled. Specifically, referring to FIG. 4, a first metal silicide filler 1171 may be formed in the void 1131 while a second metal silicide filler 1172 may be formed in the void 1132.

Further, referring to FIG. 5, when the portion of the metal silicide layer 117 formed on the first dielectric layer 113 is removed, the first metal silicide filler 1171 formed in the void 1131 and the second metal silicide filler 1172 formed in the seam 1132 may unlikely be removed. As a result, the first metal silicide filler 1171 and the second metal silicide filler 1172 may still remain in the first dielectric layer 113, which may lead to degraded insulating properties of the first dielectric layer 113, causing high risk of current leaking between word lines 119.

Moreover, because of the presence of the void 1131 and the seam 1132, when the amount of the first dielectric layer 113 removed by the etch-back process is relatively large, the void 1131 and the seam 1132 may be exposed at the etched surface of the first dielectric layer 113. Further, during a subsequent cleaning process, acid treatment may enlarge the sizes of the exposed void 1131 and the exposed seam 1132. Therefore, after the deposition of the metal silicide material, more metal silicide material may be filled into the void 1131 and the seam 1132. As a result, the k value of the first dielectric layer 113 may be changed, leading to degradation of the dielectric performance. On the other hand, when the amount of the first dielectric layer 113 removed by the etch-back process is relatively small, the exposed portion of the control gate layer 107 may not be sufficient, leading to insufficient amount of the metal silicide material formed on the gate electrode. As electrical signals in NAND flash memory is conducted through the metal silicide layer 117, insufficient amount of the metal silicide material may further cause degradation of the performance of the NAND flash memory. Therefore, the amount of the material of the first dielectric layer to be removed by the etch-back process may need to be strictly controlled in existing methods, thus the process window for the etch-back process may be relatively narrow.

Specifically, the stop layer 115 is often made of a nitride material. The nitride material usually demonstrates poor filling properties, thus during the formation of the stop layer 115, the nitride material may not be efficiently filled into the void 1131 and the seam 1132. Even in a case where a small amount of the nitride material is indeed filled into the void 1131 and the seam 1132, the electric properties of the first dielectric layer 113 may still be poor because of the huge difference between the k value of the material of the stop layer 115 and the k value of the material of the first dielectric layer 113.

Moreover, prior to forming the metal silicide layer 117, a cleaning process may be performed on the structure obtained after the etch-back process in order to ensure sufficient contact between the metal silicide layer 117 and the control gate layer 107. However, the cleaning process may enlarge the sizes of the void 1131 and the seam 1132 so that the void 1131 and the seam 1132 may more likely be filled with the metal silicide material following the process for forming the metal silicide layer 117. In addition, the annealing process during the formation of the metal silicide layer 117 may also make it easier for the metal silicide material to fill into the void 1131 and the seam 1132.

Figure 10:
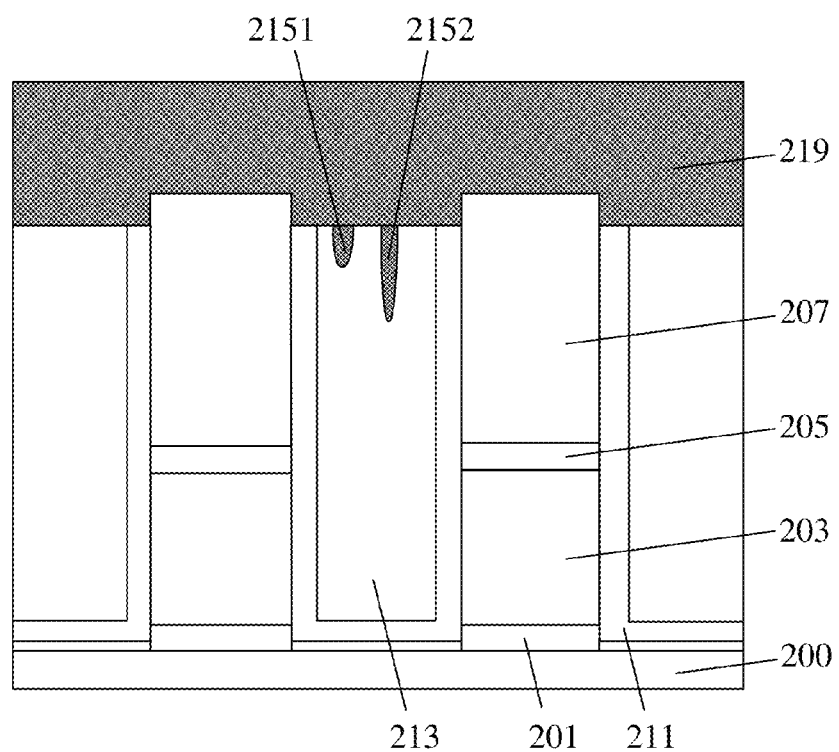
Figure 11:
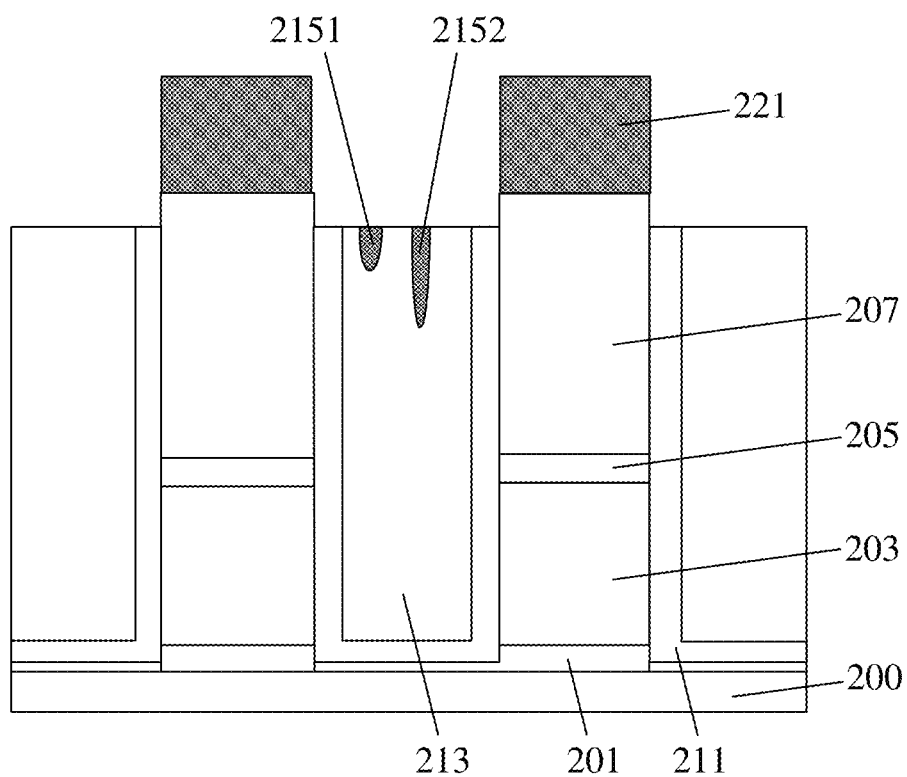
Figure 12:
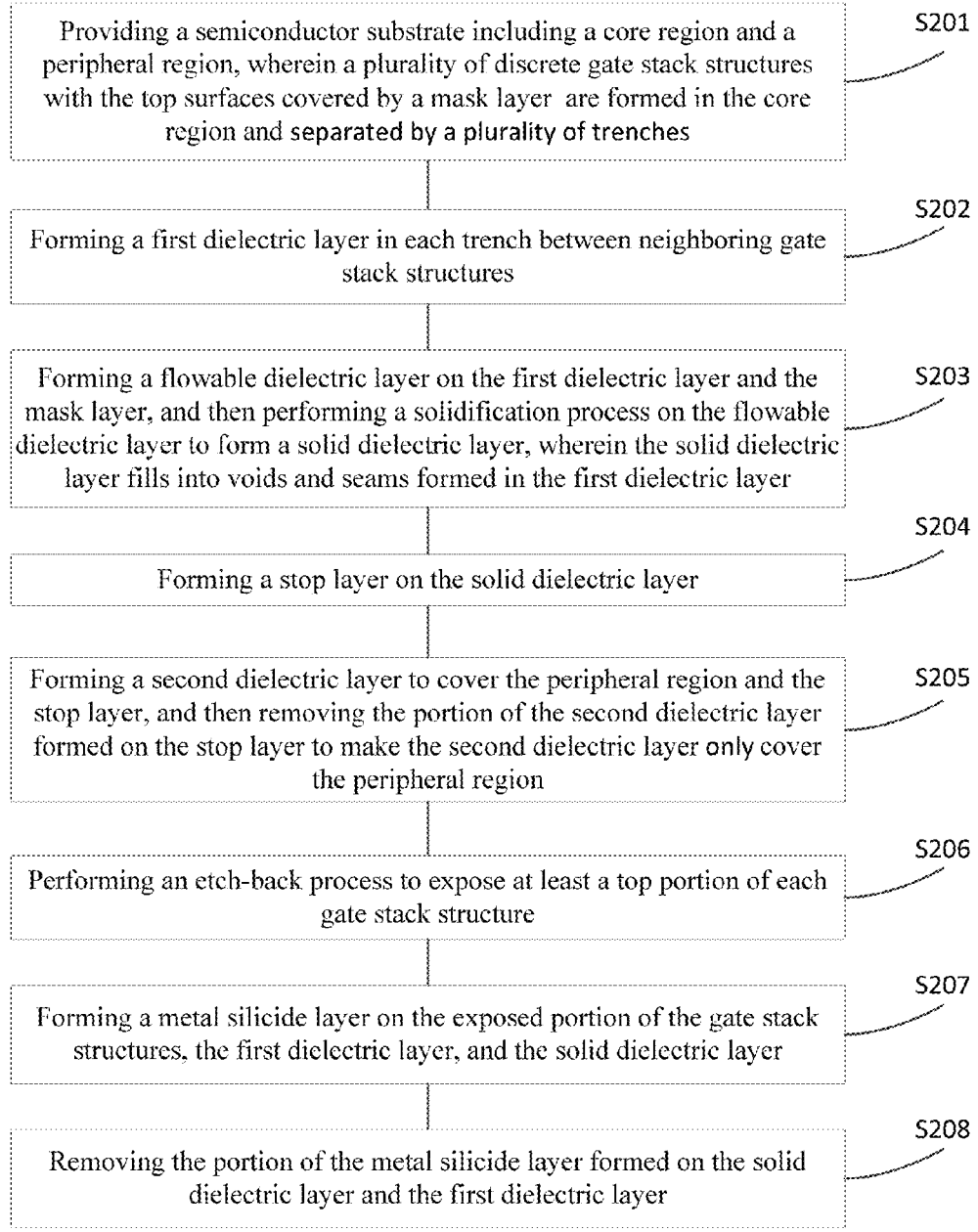
FIG. 12 illustrates a flowchart of the exemplary fabrication process for an NAND flash memory consistent with disclosed embodiments.

In view of the above problems in existing methods, the present disclosure provides an improved method for forming an NAND flash memory. FIG. 12 shows a flowchart of an exemplary fabrication method for the NAND flash memory consistent with the disclosed embodiments. FIGS. 6-11 shows schematic views of semiconductor structures corresponding to certain stages of the exemplary fabrication method.

Figure 6:
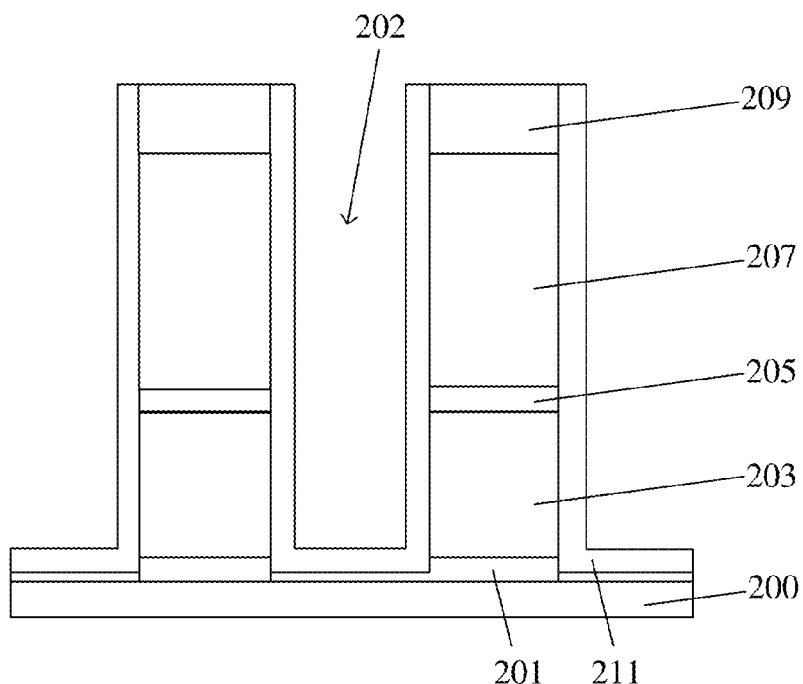
FIGS. 6-11 illustrate schematic views of semiconductor structures corresponding to certain stages of an exemplary fabrication method consistent with various disclosed embodiments.

Referring to FIG. 12, at the beginning of the fabrication process, a semiconductor substrate is provided (S201). FIG. 6 shows a schematic view of the semiconductor substrate 200.

Referring to FIG. 6, the semiconductor substrate 200 may include a core region (not labeled) and a peripheral region (not shown). For illustration purposes, only a portion of the core region is shown in FIGS. 6-11; while the peripheral region is not shown in FIGS. 6-11.

In one embodiment, the semiconductor substrate 200 may be a silicon substrate, a germanium substrate, or a silicon-on-insulator (SOI) substrate. In other embodiments, the semiconductor substrate 200 may also be any other appropriate substrates including III-V compound substrates such as GaAs.

In one embodiment, the core region may be used to form the core storage circuits of the flash memory and the peripheral region may be used to form the peripheral storage circuits of the flash memory.

Further, a plurality of discrete gate stack structures (not labeled) may be formed in the core region. In addition, a plurality of trenches 202 may be formed between neighboring gate stack structures.

In one embodiment, from the bottom to the top, each gate stack structure may further include a tunnel oxide layer 201, a floating gate layer 203, a dielectric layer, and a control gate layer 207. The dielectric layer may be an oxide-nitride-oxide (ONO) layer 205. The control gate layer 207 may be made of polycrystalline silicon and may be formed by a chemical vapor deposition (CVD) method.

In one embodiment, the aspect ratio of the plurality of trenches 202 may be greater than 10:1. In a subsequent process, a first dielectric layer may be formed in each trench 202. Specifically, the first dielectric layer may be formed by high aspect ratio process-CVD (HARP-CVD) or high density plasma-CVD (HDP-CVD). When the aspect ratio of the trenches 202 is greater than 10:1, no matter which existing deposition method is adopted to form the first dielectric layer, defects such as voids and seams may inevitably appear in the formed first dielectric layer. Such defects may further lead to various detrimental conditions for subsequent fabrication processes. To certain extent, the voids and the seams may not be essentially different, because, in general, the width of the voids may be greater than the width of the seams while the depth of the seams may be larger than the depth of the voids.

Referring to FIG. 6, a mask layer 209 may be formed on each control gate layer 207. The mask layer 209 may be made of $SiN_x$. The mask layer 209 may also be a stack structure of $SiO_x$ and $SiN_x$. The mask layer 209 may be formed by a CVD method. In other embodiments, the mask layer 209 may be made of any appropriate material and may be formed by any appropriate method.

In one embodiment, the mask layer 209 may be used to assist the formation of the plurality of gate stack structures in the core region. Specifically, a mask material layer may first be formed on both the core region and the peripheral region. Further, the mask material layer may be patterned. As shown in FIG. 6, after the patterning process, the mask layer 209 may then be formed by the remaining portion of the mask material layer in the core region. The mask layer 209 may define the plurality of gate stack structures in the core region. Moreover, a mask layer, not shown in FIG. 6, may also be formed in the peripheral region. The mask layer formed in the peripheral region may define gate stack structures in the peripheral region.

Specifically, a method forming the gate stack structures in different regions may include forming a photoresist layer on the mask material layer, patterning the photoresist layer, and then etching the mask material layer using the patterned photoresist layer as an etch mask until the control gate layer 207 in the core region is exposed. As such, the mask layer 209 may be patterned. The method further includes removing the remaining photoresist layer, and then etching the control gate layer 207, the ONO layer 205, the floating gate layer 203, and the tunnel oxide layer 201 using the mask layer 209 formed in the core region as an etch mask. After the etching process, a plurality of discrete gate stack structures may be obtained. Moreover, each gate stack structure may include a tunnel oxide layer 201, a floating gate layer 203 formed on the tunnel oxide layer 201, an ONO layer 205 formed on the floating gate layer 203, a control gate layer 207 formed on the ONO layer 205, and a remaining mask layer 209 formed on the control gate layer 207.

In other embodiments, the mask layer may not be formed in the course of forming the gate stack structures. Instead, the gate stack structures may be formed by other appropriate method.

In one embodiment, a plurality of sidewalls 211 may be formed on the side surfaces of the plurality of gate stack structures. The sidewalls 211 cover the bottom surfaces and the side surfaces of the plurality of trenches 202 formed between neighboring gate stack structures. In addition, the plurality of sidewalls 211 may also cover the side surfaces of the mask layer 209.

Figure 7:
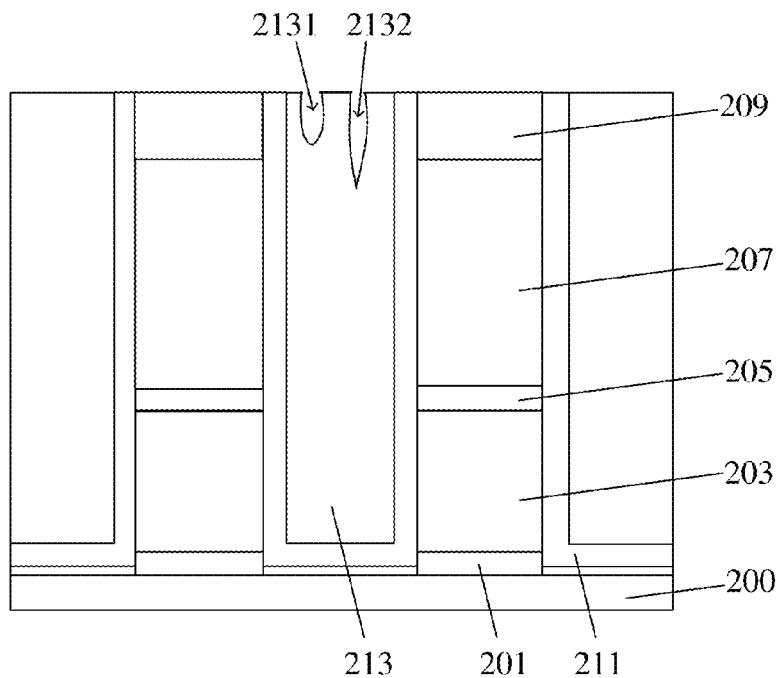

Further, returning to FIG. 12, a first dielectric layer may be formed in each trench (S202). FIG. 7 shows a schematic cross-section view of the corresponding semiconductor structure.

Referring to FIG. 7, a first dielectric layer 213 may be formed to fill the plurality of trenches 202. In one embodiment, the first dielectric layer 213 may be made of $SiO_x$. The first dielectric layer 213 may be formed by HARP-CVD or HDP-CVD. Generally, compressive stress may exist in dielectric layer formed by HDP-CVD while tensile stress may exist in dielectric layer formed by HARP-CVD. However, regardless of which one of the two methods being used, the subsequently-formed first dielectric layer may contain a number of defects, such as voids, seams, etc., because the aspect ratio of the trenches 202 is greater than 10:1. For illustration purposes, the structure shown in FIG. 7 is described to contain one void 2131 and one seam 2132. One may note that in practice, the number of the voids 2131 and/or the number of the seams 2132 in the first dielectric layer 213 may be more than one.

Figure 8:
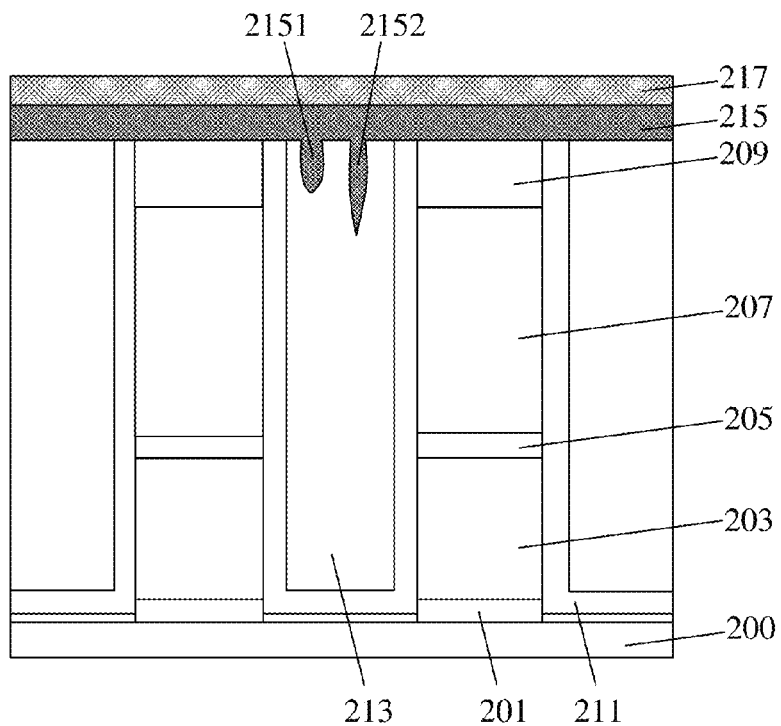

Further, returning to FIG. 12, a flowable dielectric layer may be formed on the first dielectric layer and the mask layer, and then a solidification process may be performed on the flowable dielectric layer to form a solid dielectric layer (S203). FIG. 8 shows a schematic cross-section view of the corresponding semiconductor structure.

Referring to FIG. 8, a flowable dielectric layer may be formed on the surfaces of the first dielectric layer 213 and the mask layer 209. The flowable dielectric layer may also cover the top surfaces of the sidewalls 211. Then, a solidification treatment process may be performed on the flowable dielectric layer to convert the flowable dielectric layer into a solid dielectric layer 215. That is, the solid dielectric layer 215 is formed from the flowable dielectric layer through the solidification treatment process. The solid dielectric layer 215 may be situated on the surfaces of the first dielectric layer 213 and the mask layer 209 as well as the top surfaces of the sidewalls 211.

In one embodiment, because the flowable dielectric layer is formed on the first dielectric layer 213 containing a void 2131 and a seam 2132, the flowable dielectric layer may fill into the void 2131 and the seam 2132. After performing the solidification treatment process, the flowable dielectric layer filled into the void 2131 may form a solid dielectric filler 2151 and the flowable dielectric layer filled into the seam 2132 may form a solid dielectric filler 2152. Each of the solid dielectric filler 2151 and the solid dielectric filler 2152 may be a portion of the solid dielectric layer 215.

In other embodiments, when no mask layer is formed on the gate stack structures, the solid dielectric layer may be formed on the first dielectric layer and the top surfaces of the plurality of gate stack structures.

In one embodiment, the flowable dielectric layer may be a flowable polymer. The solid dielectric layer 215 may be made of $SiO_x$. The flowable polymer and $SiO_x$ may be formed by a fluid CVD method. The fluid CVD method may include a deposition process and a conversion process following the deposition process. Specifically, during the deposition process, a silica ($SiO_x$) precursor may be used to form flowable polymer through free radical polymerization, while during the conversion process, ozone steam may be used to convert the flowable polymer into $SiO_x$ through oxidation.

Moreover, during the deposition process, the silica precursor may be used to react with ammonia plasma to form a flowable polymer and thus fill the void 2131 and the seam 2132. The thickness of the flowable polymer may be defined by the corresponding process time.

During the solidification treatment process, the flowable polymer may be oxidized when the temperature of the ozone steam is controlled in a range of 100° C. to 200° C. At a temperature between 100° C. and 200° C., oxidation of the flowable polymer by ozone steam may be uniform and stable. Therefore, after performing the solidification treatment process, the flowable polymer may form solid $SiO_2$, i.e. the solid dielectric layer 215.

In one embodiment, the thickness of the solid dielectric layer 215 may be controlled to be above 200 Å so that the solid dielectric filler 2151 and the solid dielectric filler 2152 may completely fill the void 2131 and the seam 2132. In addition, with a thickness above 200 Å, the dielectric layer 215 may also meet the requirements of subsequent fabrication processes. In particular, the dielectric layer 215 may meet the requirement for subsequently performing an etch-back process.

In certain other embodiments, the flowable dielectric layer may be made of graphene oxide or graphite oxide. That is, graphene oxide or graphite oxide may be used for forming the flowable dielectric layer and fill the void 2131 and the seam 2132. Correspondingly, the solid dielectric layer 215 may be made of solidified graphene oxide or solidified graphite oxide obtained after performing the solidification treatment process.

A specific method to form the flowable dielectric layer using graphene oxide and to fill the void 2131 and the seam 2132 may include performing a plasma treatment process on the surface of the structure shown in FIG. 7. The plasma treatment process may use nitrogen as a reaction gas source to generate plasma. The method may further include forming a copper layer on the surface of the structure after performing the plasma treatment process. The copper layer may be formed by sputtering. Further, the copper layer may fill the void 2131 and the seam 2132. The method may then include forming a graphene oxide layer on the copper layer through a CVD process and then forming a polymethyl methacrylate (PMMA) layer on the graphene oxide layer. The PMMA layer may be used to protect the graphene oxide layer. The method may further include performing a wet etching process to remove the copper layer. The portion of the copper layer filled in the void 2131 and the seam 2132 may be removed by the wet etching process so that the void 2131 and the seam 2132 may be exposed again. After the removal of the copper layer, the graphene oxide layer may replace the original copper layer and thus may be settled down on the surface of the structure shown in FIG. 7. In addition, the graphene oxide layer may also fill the re-exposed void 2131 and the seam 2132. Finally, the method may include removing the PMMA layer and performing a solidification treatment process such as a baking process to solidify the graphene oxide layer.

In the fabrication process described above, a method to form graphene oxide from natural graphite may include the following steps. First, at a temperature of 80° C., a certain amount of natural graphite, concentrated sulfuric acid, $K_2S_2O_8$, and $P_2O_5$ may be mixed together.

A mixing time of 4 hours may be used for the mixing process. The obtained mixture may then be cooled down to room temperature. Further, the mixture may be diluted with deionized water. After 12 hours of settling, the mixture may be separated by centrifuge technology and then may be rinsed by deionized water again to obtain pre-oxidized graphite. Concentrated sulfuric acid and $KMnO_4$ may then be used to further oxidize the pre-oxidized graphite for 2 hours with the reaction mixture sitting in an ice-water bath. Further, the re-oxidized mixture may be diluted with deionized water and may be kept in an ice-water bath for 2 more hours. The mixture may be diluted with deionized water again and then may be mixed with $H_2O_2$ to allow further oxidization. After oxidization using $H_2O_2$, the mixture may be separated by centrifuge technology and then may be rinsed by HCl acid and deionized water to finally obtain graphene oxide with desired water-solubility and flowability. Therefore, the graphene oxide formed following the above fabrication procedure may be used as the flowable dielectric layer.

Returning to FIG. 12, further, a stop layer may be formed on the solid dielectric layer (S204). FIG. 8 shows a schematic cross-section view of the corresponding semiconductor structure with a stop layer 217 formed on the solid dielectric layer 215.

Further, returning to FIG. 12, a second dielectric layer may be formed to cover the peripheral region (S205). Specifically, after forming the stop layer 217, a second dielectric layer (not shown) may be further formed on the peripheral region (not shown) and also on the stop layer 217 in the core region. The second dielectric layer may be intended to be formed only on the peripheral region. Therefore, the portion of the second dielectric layer formed in the core region may need to be removed by a subsequent process.

Specifically, a planarization process may be performed to remove the portion of the second dielectric layer formed on the stop layer 217. The planarization process may be stopped as the stop layer 217 is reached. Thus, the portion of the second dielectric layer formed in the core region may be removed by the planarization process. In one embodiment, a chemical mechanical polishing (CMP) method may be used in the planarization process.

Figure 9:
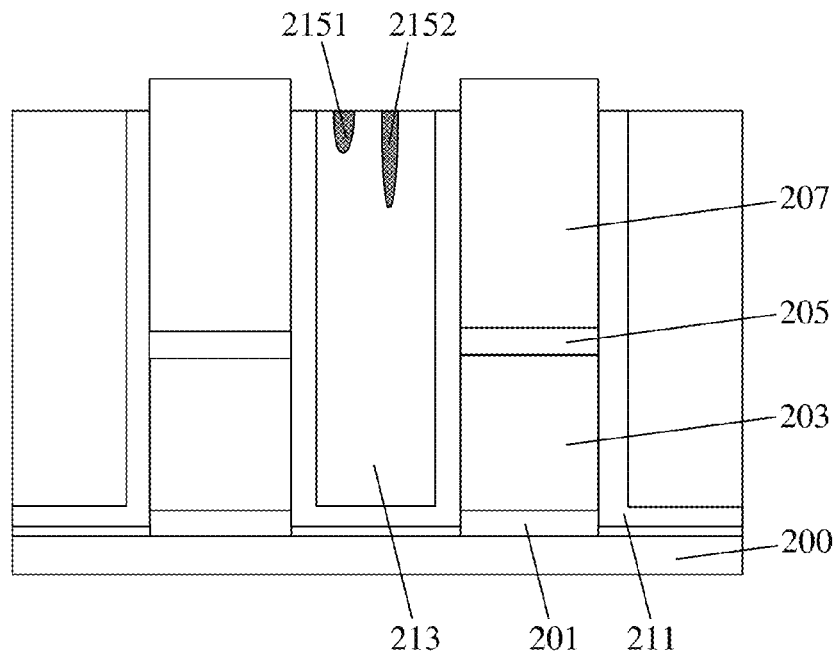

Further, returning to FIG. 12, at least a top portion of the gate stack structures may be exposed by performing an etch-back process (S206). FIG. 9 shows a schematic cross-section view of the corresponding semiconductor structure.

Referring to FIG. 9, the remaining portion of the stop layer 217 together with the mask layer 209 (referring to FIG. 8), the solid dielectric layer 215, and a portion of the first dielectric layer 213 may be removed by an etch-back process to expose at least a portion of the gate stack structures. The portion of each gate stack structure exposed after the etch-back process is the control gate layer 207. Specifically, the top surface and a portion of the side surface of the control gate layer 207 may be exposed after the etch-back process.

In one embodiment, a dry etching method may be used in the etch-back process. Further, the etch-back process may expose the side surfaces of at least a top portion of the control gate layer 207. The reaction gas used in the etch-back process may include CF.

In certain circumstances, a portion of the solid dielectric layer 215 may remain on the first dielectric layer 213 after the etch-back process. In certain other circumstances, the remaining solid dielectric layer 215 may only fill the void 2131 and the seam 2132 situated in the top portion of the first dielectric layer 213. That is, the solid dielectric filler 2151 and the solid dielectric filler 2152 shown in FIG. 9 may be the only remaining portion of the solid dielectric layer 215 after the etch-back process.

In one embodiment, referring to FIG. 9, the etch-back process may completely remove the portion of the solid dielectric layer 215 formed on the first dielectric layer 213 and only retain the solid dielectric filler 2151 and the solid dielectric filler 2152, i.e. the portion of the solid dielectric layer 215 filled into the void 2131 and the seam 2132, respectively. A solid dielectric layer 215 with a thickness in the range discussed above may ensure the successful performance of the etch-back process and the realization of the desired structure following the etch-back process.

In one embodiment, because a mask layer 209 may be formed prior to the etch-back process, the etch-back process may not only etch the remaining portion of the stop layer 217 and the first dielectric layer 213, but also simultaneously etch the mask layer 209. In other embodiments, when the mask layer 209 is not formed, the etch-back process may not include etching the mask layer 209.

Returning to FIG. 12, a metal silicide layer may be formed on the exposed portion of the gate stack structures, the first dielectric layer, and the solid dielectric layer (S207). FIG. 10 shows a schematic cross-section view of the corresponding semiconductor structure.

Referring to FIG. 10, a metal silicide layer 219 may be formed to cover the exposed portion of the gate stack structures, the first dielectric layer 213, and the remaining portion of the solid dielectric layer 215. Prior to the formation of the metal silicide layer 219, a cleaning process may often be performed on the semiconductor substrate obtained through the fabrication process described above.

The metal silicide layer 219 may be formed to cover the surface of the exposed portion of the gate stack structures after the etch-back process. That is, the metal silicide layer 219 may cover the top surface and a portion of the side surface of each control gate layer 207, the first dielectric layer 213, and the remaining portion of the solid dielectric layer 215. In one embodiment, the metal silicide layer 219 may be made of NiSi, WSi, MoSi, TiSi, CoSi, or TlSi. The metal silicide layer 219 may be formed by a process including steps such as rapid thermal annealing, etc.

Further, returning to FIG. 12, the portion of the metal silicide layer formed on the solid dielectric layer and the first dielectric layer may be removed (S208). FIG. 11 shows a schematic cross-section view of the corresponding semiconductor structure.

Referring to FIG. 11, the portion of the metal silicide layer 219 formed on the solid dielectric layer 215 and the first dielectric layer 213 may be removed. After the removal of the portion of the metal silicide layer 219, only the portion of the metal silicide layer 219 formed on the plurality of control gate layers 207 may be retained. The remaining portion of the metal silicide layer 219 may be used as word lines 221.

In one embodiment, the portion of the metal silicide layer 219 formed on the solid dielectric layer 215 and the first dielectric layer 213 may be removed by a wet etching process. Further, during the formation of the solid dielectric layer 215, the solid dielectric filler 2151 and the solid dielectric filler 2152 may also be formed in the corresponding void 2131 and the seam 2132, respectively. That is, the void 2131 and the seam 2132 may be filled with a solid dielectric material prior to forming the metal silicide layer 219 so that the metal silicide layer 219 may not enter the void 2131 and the seam 2132. Therefore, the entire portion of metal silicide layer 219 formed on the solid dielectric layer 215 and the first dielectric layer 213 may be completely removed without leaving any residue in the solid dielectric layer 215 or in the first dielectric layer 213.

According to the disclosed method, a flowable dielectric layer may be formed on the surface of the plurality of gate dielectric structures and the surface of the first dielectric layer 213 after performing an etch-back process. The flowable dielectric layer may then be solidified to form a solid dielectric layer 215. Further, a metal silicide layer 219 may be formed on the solid dielectric layer 215, the first dielectric layer 213, and the gate stack structures during a subsequent process. Finally, the portion of the metal silicide layer 219 formed on the solid dielectric layer 215 and the first dielectric layer 213 may be removed, and thus only the top surfaces of the gate stack structures may be covered by the metal silicide layer 219 in the finished structure of the NAND flash memory.

In the disclosed method, by forming the flowable dielectric layer on the first dielectric layer 213 after the etch-back process, the flowable dielectric layer may fill corresponding voids 2131 and seams 2132 situated in the top portion of the first dielectric layer 213. Subsequently, after performing a solidification treatment process, the flowable dielectric layer may be converted into a solid dielectric layer 215. In the meantime, the portion of flowable dielectric layer filled in the voids 2131 may become solid dielectric filler 2151 while the portion of flowable dielectric layer filled in the seams 2132 may become solid dielectric filler 2152.

Further, according to the disclosed method, when the metal silicide layer 219 is further formed on the solid dielectric layer 215 and the first dielectric layer 213, the voids 2131 and the seams 2132 may still be filled by solid dielectric filler 2151 and solid dielectric filler 2152, respectively. Therefore, the metal silicide layer 219 may not be able to enter the voids 2131 or the seams 2132. Thus, after removing the portion of the metal silicide layer 219 formed on the solid dielectric layer 215 and the first dielectric layer 213, no residue of the metal silicide layer 219 may be left in the first dielectric layer 213.

In addition, the solid dielectric layer 215 may be formed from the flowable dielectric layer by performing a solidification treatment process. Because of the specific formation method of the solid dielectric layer 215, voids and seams may not likely appear in the formed solid dielectric layer 215. Therefore, residue of the metal silicide layer 219 may not be expected to appear in the solid dielectric layer 215.

As described above, the disclosed method may improve the dielectric performance of the dielectric layer (including both the first dielectric layer 213 and the solid dielectric layer 215) between word lines 221 and, thus, the risk of current leaking between word lines 221 may be reduced.

Further, since the disclosed method may prevent leaving metal silicide residue in the dielectric layer between neighboring word lines 221, the amount of material removed by the etch-back process may not need to be strictly controlled. Therefore, the disclosed method may improve the process window for the etch-back process, and thus improve the process window for the entire fabrication process for the NAND flash memory.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an NAND flash memory, comprising:
   providing a semiconductor substrate including a core region and a peripheral region;
   forming a plurality of discrete gate stack structures in the core region with neighboring gate stack structures separated by a trench;
   forming a first dielectric layer to fill each trench;
   forming a flowable dielectric layer on the first dielectric layer and the gate stack structures, wherein the flowable dielectric layer is graphene oxide or graphite oxide;
   performing a solidification treatment process on the flowable dielectric layer to form a solid dielectric layer, wherein voids and seams formed in a top portion of the first dielectric layer are filled by the solid dielectric layer;
   removing the solid dielectric layer and a portion of the first dielectric layer by an etch-back process to expose at least a top portion of the gate stack structures;
   forming a metal silicide layer on an exposed portion of the gate stack structures and the first dielectric layer; and
   removing a portion of the metal silicide layer formed on the first dielectric layer.

2. The method for fabricating the NAND flash memory according to claim 1, after performing the solidification treatment process, further including:
   forming a stop layer on the solid dielectric layer;
   forming a second dielectric layer on the stop layer and on the peripheral region;
   performing a planarization process until reaching the stop layer to remove a portion of the second dielectric layer formed on the stop layer; and
   removing a remaining portion of the stop layer.

3. The method for fabricating the NAND flash memory according to claim 1, wherein each gate stack structure further includes a tunnel oxide layer, a floating gate layer, a dielectric layer, and a control gate layer formed sequentially on the semiconductor substrate.

4. The method for fabricating the NAND flash memory according to claim 3, wherein the dielectric layer formed in each gate stack structure is an oxide-nitride-oxide layer.

5. The method for fabricating the NAND flash memory according to claim 1, wherein,
   the flowable dielectric layer is made of a flowable polymer;
   the solid dielectric layer is made of $SiO_x$; and
   the flowable polymer and $SiO_x$ are deposited by fluid chemical vapor deposition.

6. The method for fabricating the NAND flash memory according to claim 5, wherein the fluid chemical vapor deposition includes:
   a deposition process using $SiO_x$ precursor to form flowable polymer through free radical polymerization; and
   a conversion process to form $SiO_x$ by using ozone steam to oxidize the flowable polymer.

7. The method for fabricating the NAND flash memory according to claim 6, wherein the flowable polymer is oxidized in an ozone steam at a temperature in a range of 100° C. to 200° C.

8. The method for fabricating the NAND flash memory according to claim to claim 1, wherein a thickness of the solid dielectric layer is greater than 200 Å.

9. The method for fabricating the NAND flash memory according to claim 1, wherein:
   a dry etching method is used during the etch-back process;
   a reaction gas used in the etch-back process includes CF; and
   the etch-back process exposes at least a portion of the side surface of the control gate layer.

10. The method for fabricating the NAND flash memory according to claim 1, wherein the metal silicide layer is made of one of NiSi, WSi, MoSi, TiSi, CoSi, and TiSi.

11. The method for fabricating the NAND flash memory according to claim 1, wherein:
   the first dielectric layer is formed by a high aspect ratio process-chemical vapor deposition (HARP-CVD) method or a high density plasma-chemical vapor deposition (HDP-CVD) method; and
   the aspect ratio of the trench is greater than 10:1.

12. The method for fabricating the NAND flash memory according to claim 2, wherein:
   prior to the formation of the stop layer, a mask layer is formed on the gate stack structures; and
   the etch-back process performed to etch the remaining portion of the stop layer and the first dielectric layer also etches the mask layer.

13. The method for fabricating the NAND flash memory according to claim to claim 12, wherein the mask layer is a SiN layer or a stack structure of $SiO_x$ and SiN.

14. The method for fabricating the NAND flash memory according to claim 2, wherein the planarization process performed on the second dielectric layer is a chemical mechanical polishing process.

15. The method for fabricating the NAND flash memory according to claim 1, wherein prior to forming the metal silicide layer, a cleaning process is performed on a semiconductor structure obtained after the etch-back process.

16. The method for fabricating the NAND flash memory according to claim 1, wherein:
   a remaining portion of the metal silicide layer on each gate stack structure is used as a word line.

* * * * *